United States Patent [19]

Pascucci et al.

[11] Patent Number: 5,276,644
[45] Date of Patent: Jan. 4, 1994

[54] SENSE CIRCUIT FOR STORAGE DEVICES SUCH AS NON-VOLATILE MEMORIES, WITH COMPENSATED OFFSET CURRENT

[75] Inventors: Luigi Pascucci, Milan; Marco Olivo, Bergamo, both of Italy

[73] Assignee: SGS-Thomson Microelectronics, S.r.l., Agrate Brianza, Italy

[21] Appl. No.: 791,453

[22] Filed: Nov. 13, 1991

[30] Foreign Application Priority Data

Nov. 19, 1990 [IT] Italy .................. 90830530.3

[51] Int. Cl.$^5$ .............................................. G11C 7/00
[52] U.S. Cl. ........................... 365/189.01; 365/207; 365/210
[58] Field of Search ............ 365/189.01, 207, 210; 307/355, 530

[56] References Cited

U.S. PATENT DOCUMENTS

| 4,604,732 | 8/1986 | van Tran | 365/207 |
| 4,670,675 | 6/1987 | Donoghue | 307/330 |
| 4,713,797 | 12/1982 | Morton et al. | 365/210 |
| 4,868,790 | 9/1989 | Wilmoth et al. | 365/210 |
| 4,949,307 | 8/1990 | Campardo | 365/207 |
| 5,091,888 | 2/1992 | Akaogi | 365/210 |

FOREIGN PATENT DOCUMENTS

0031643 7/1981 European Pat. Off. .
0270750 6/1988 European Pat. Off. .

OTHER PUBLICATIONS

1990 Symposium on VLSI Circuits Digest of Technical Papers, "A 36 ns 1 Mbit CMOS EPROM with New Data Sensing Technique" by H. Nakai, K. Kanazawa, et al.

*Primary Examiner*—Eugene R. LaRoche
*Assistant Examiner*—Tan Nguyen

[57] ABSTRACT

A non-volatile memory in which, during read operations, the sense amplifier's first input is connected not only to a selected non-programmed reference cell, but also to a current of a value one half the current that flows in a programmed cell; and the sense amplifier's second input is connected not only to a selected matrix cell to be read, but also to a current of a value one half the current that flows in a non-programmed cell.

20 Claims, 3 Drawing Sheets

SENSE CIRCUIT FOR STORAGE DEVICES SUCH AS NON-VOLATILE MEMORIES, WITH COMPENSATED OFFSET CURRENT

TECHNICAL FIELD OF THE INVENTION

This invention is concerned with an improved sense circuit, of the variable offset current type, for recognizing the nonprogrammed or programmed status of the cells in storage devices such as CMOS non-volatile memories.

BACKGROUND OF THE INVENTION

In circuits made with CMOS technology, where programmable components are used to make non-volatile memories (ROM, EPROM, EEPROM, FLASH), it is necessary to provide a reference system which is able to recognize programmed elements, which are turned off and which therefore draw a zero current when driven, from the nonprogrammed, or virgin, elements, which are on, and therefore draw a current when driven. Recognition is achieved by comparing, in a differential sense amplifier, the current in the element or cell which it is desired to read with the current in a reference cell, which may itself be nonprogrammed or programmed.

However, the sense amplifier must be able to provide an output also when reading a nonprogrammed matrix cell, in which case both its inputs would be equal. Therefore, it is known to shift the discriminating threshold by a method known as "variable offset current", according to which an offset current of half the current in a nonprogrammed cell is permanently applied to the reading input of the amplifier.

While the above approach gives satisfactory results in a limited range of supply voltages, it is liable to fail at high supply voltages, because (as will be shown in more detail below) then the current in the programmed cell increasingly departs from zero, until it exceeds the value of the threshold current (i.e., half the current in a nonprogrammed cell).

The above situation effectively limits the range of acceptable supply voltages, or, from another point of view, compels the manufacturer to discard devices which would otherwise operate satisfactorily at middle voltages, because they fail at the high end of the voltage range.

The main object of the invention is therefore to provide an improved sense circuit, of the variable offset current type, for recognizing the nonprogrammed or programmed status of the cells in storage devices such as non-volatile memories, which improved sense circuit compensates the above drift of the current in the programmed cell, and extends the operating range of the sense circuit, particularly in that it allows operation in a wider range of voltage supplies.

Another object is to increase the manufacturing yield of such sense devices.

SUMMARY OF THE INVENTION

The invention achieves the above and other objects and advantages, such as will appear from the following disclosure, with an improved sense circuit for recognizing the nonprogrammed or programmed status of cells in storage devices such as non-volatile memories, comprising a sense amplifier having a first input connected to a number of selectable nonprogrammed reference cells, and a second input connected to a number of selectable matrix cells and to an auxiliary nonprogrammed cell driven by first circuit means adapted to generate in the auxiliary nonprogrammed cell a current of a value one half the current that flows in a nonprogrammed reference cell when selected. The sense circuit comprises a compensatory programmed cell having a grounded source, a drain connected to the second input of the sense amplifier, and a gate driven by second circuit means for causing a current to flow in the compensatory cell of a value approximately one half the current flowing in a programmed cell when selected.

BRIEF DESCRIPTION OF THE DRAWINGS

The invention will now be described in more detail with reference to a preferred embodiment given by way of illustrative and nonlimiting example, and with the aid of the attached drawings, wherein.

DETAILED DESCRIPTION

Figure 1:
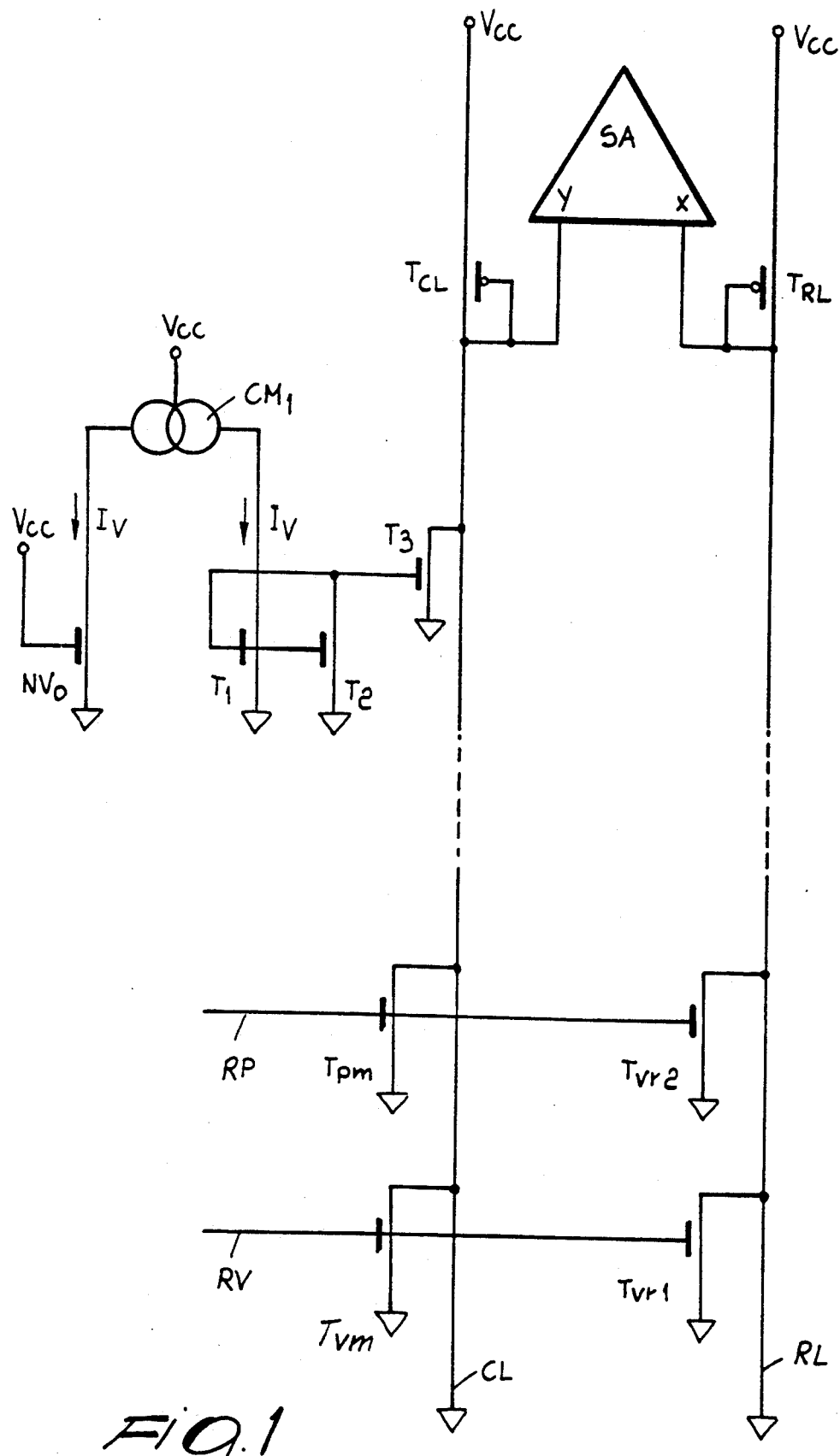
FIG. 1 is a diagram of a variable offset current sense circuit according to the prior art.

In FIG. 1, a differential sense amplifier SA has a first input X and a second input Y. $T_{vm}$ and $T_{pm}$ are a nonprogrammed cell and a programmed cell, respectively, which are part of a matrix of cells or transistors (not shown fully) of a storage device such as a ROM, made with CMOS technology. Each of the cells $T_{vm}$ and $T_{pm}$ has a grounded source, a drain connected to a column line CL tied to a diode-connected, P-channel load transistor $T_{CL}$ supplied by voltage $V_{cc}$ and to input Y of the sense amplifier, and a gate connected to a row line RV or RP, respectively. Each of the load transistors $T_{CL}$ can be turned on, and each of the row lines can selectively be driven high, by means not shown, as well known in the art, to select the cell at the crosspoint of the selected column and row. If the selected cell is nonprogrammed, such as $T_{vm}$, a current $I_{vm}$ is caused to flow through it, While, if the selected cell is programmed, such as $T_{pm}$, an ideally null current $I_{pm}$ will be caused to flow through it.

$T_{vr1}$ and $T_{vr2}$ are two nonprogrammed reference cells, corresponding to cells $T_{vm}$ and $T_{pm}$, respectively, and each of the reference cells has a grounded source, a drain connected to a reference line RL tied to a diode-connected, P-channel transistor $T_{RL}$ supplied by voltage $V_{cc}$ and to input X of the sense amplifier, and a gate tied to the row line RV or RP of the corresponding row of matrix cells. Load transistor $T_{RL}$ can be turned on by means not shown, to drive reference line RL high, simultaneously with column line CL. As known in the art, there is a nonprogrammed reference cell for each row of matrix cells in the device.

Load transistor $T_{CL}$ and $T_{RL}$ are equal, and in order to allow the sense amplifier to sense a differential input even when reading a nonprogrammed matrix cell, as known in the art, an enhancement transistor $T_3$ has a grounded source, a drain connected to input Y of the sense amplifier, and a gate driven by appropriate circuit means. The latter circuit means comprises a nonprogrammed cell $NV_0$ having a grounded source, a gate connected to a supply voltage $V_{cc}$, and a drain connected to one of two terminals of a current mirror $CM_1$, and two enhancement transistors $T_1$ and $T_2$ connected in parallel, and having their sources grounded and their drains connected to the other terminal of current mirror $CM_1$. Transistors $T_1$ and $T_2$ are identical to each other and to $T_3$, and their drains are also connected to the gate of transistor $T_3$, thus causing, as known in the art, a current to flow in $T_3$ of a value one half the current $I_v$. The total current through load $T_{CL}$ will then substantially be either one half or one and a half the current $I_v$, ($I_v/2$ or $3I_v/2$), depending on the status on the matrix cell being read, and the difference with the current in the reference line will ideally have in both cases the same amplitude $I_v/2$, but a positive or negative sign depending on the matrix cell being nonprogrammed or programmed.

More specifically, when the nonprogrammed matrix cell $T_{vm}$ is selected, sense amplifier SA will compare a current $I_{vr}$ flowing in the reference line with a current $I_{vm}+I_{vr}/2$ flowing in the column line (the loads $T_{CL}$ and $T_{RL}$ being identical), and the comparison will be governed by the following inequality:

$$I_{vm}+I_{vr}/2 > I_{vr} \qquad (1)$$

When the programmed matrix cell $T_{pm}$ is selected, the following inequality will hold:

$$I_{pm}+I_{vr}/2 < I_{vr} \qquad (2)$$

As a rule, the nonprogrammed matrix cell and the nonprogrammed reference cell are the same, i.e., $I_{vm}=I_{vr}=I_v$. And, ideally, the current in a programmed cell is zero, i.e., $I_{pm}=0$. Then the inequalities (1) and (2) become, respectively:

$$(3/2)I_v > I_v \qquad (3)$$

$$I_v/2 < I_v \qquad (4)$$

Inequalities (3) and (4) are inherently true. However, in actual devices, and for extreme ranges in the process parameters, supply voltage, temperature, etc., it may well happen that the current $I_{pm}$ in the programmed matrix cell is different from 0, and the above inequality (4) becomes:

$$I_p < I_v/2, \qquad (5)$$

This is a limitation to the range of variation in a number of process and/or operating parameters.

Figure 3:
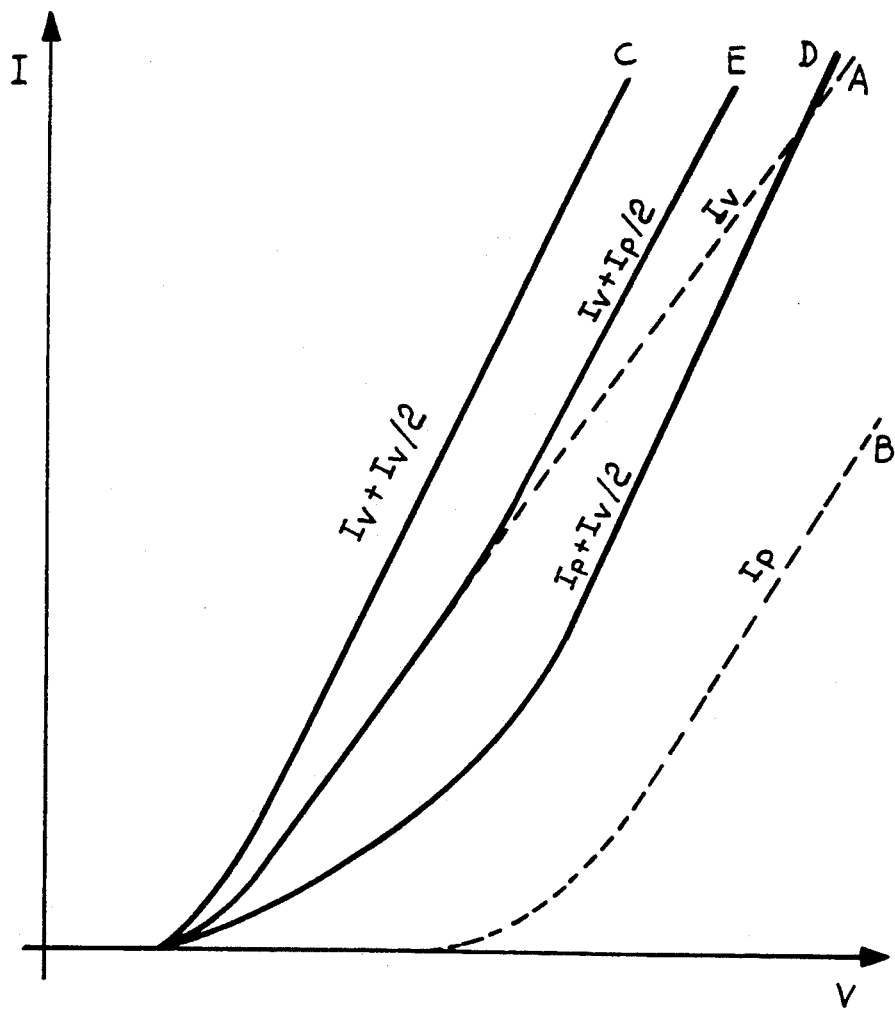
FIG. 3 is a current-voltage plot showing several current quantities plotted against an increasing supply voltage for the circuits of FIGS. 1 and 2.

With reference to FIG. 3, the lines show how the values of several current qualities of interest change as the supply voltage V increases from 0 upwards. Line A shows the current $I_v$ in a nonprogrammed cell; line B shows the current $I_p$ in a programmed cell; line C shows the current $I_v+I_v/2$ at the input of the sense amplifier when a nonprogrammed cell is selected; and line D shows the current $I_p+I_v/2$ at the input of the sense amplifier when a programmed cell is selected (Line E will be described later).

It can be seen that, while the differential input to the sense amplifier, i.e., C - A for a nonprogrammed cell and D - A for a programmed cell has the correct sign in the middle range of supply voltages, the differential input C - A will increase in amplitude with increasing voltage, due to the greater slope of line C with respect to line A, while the differential input D - A will decrease to zero and eventually change sign, as line D approaches and eventually exceeds A for very high supply voltages. When this happens, the recognition process fails, and a programmed cell is misread as nonprogrammed.

Figure 2:
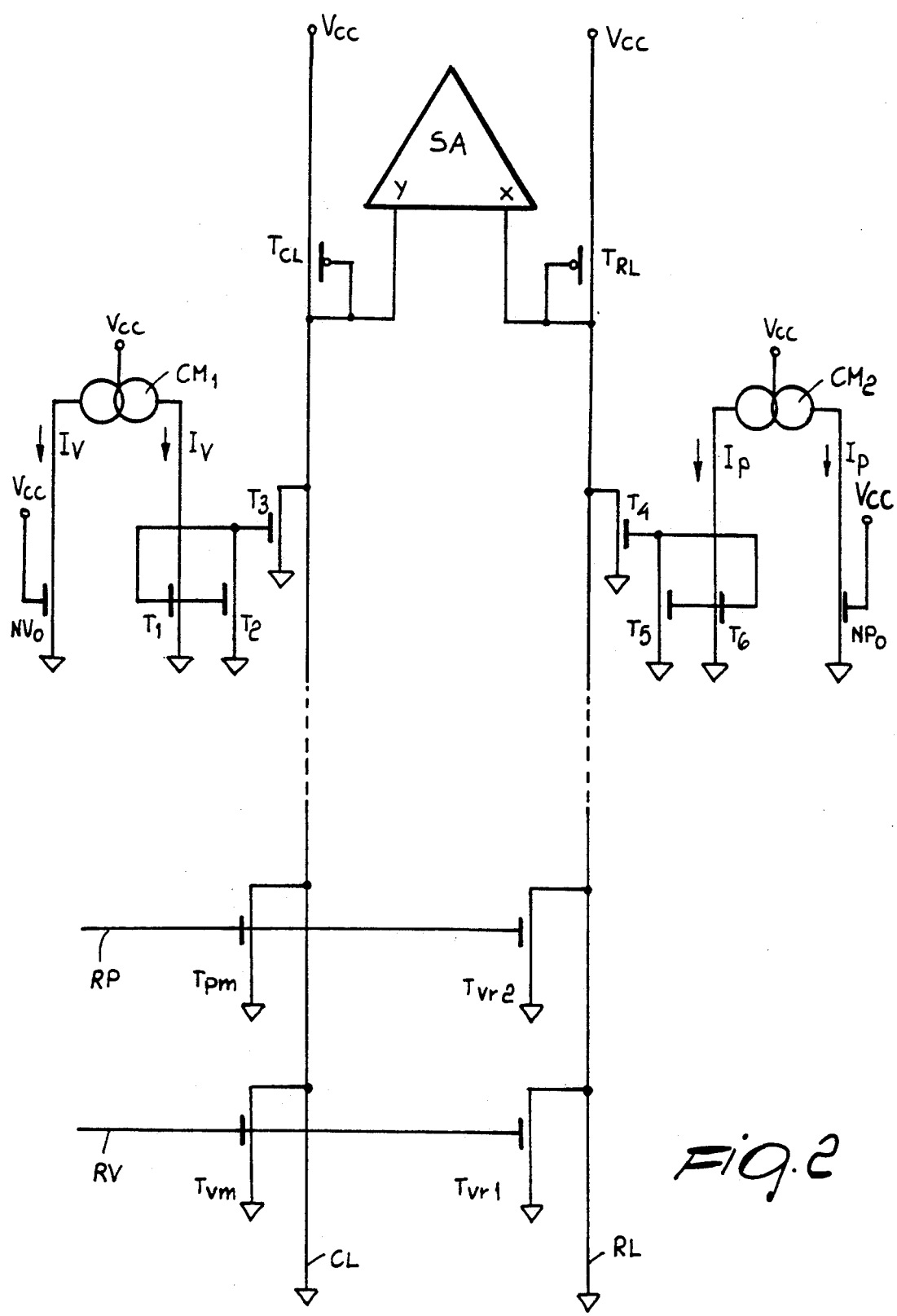
FIG. 2 is a diagram of a modulated offset current sense circuit according to the invention.

With reference to FIG. 2, an improved sense circuit according to the invention will now be described. The sense circuit is similar to the circuit of FIG. 1, and includes all the parts shown there, which are referenced with the same reference characters also in FIG. 2. However, the circuit of FIG. 2 also comprises a compensatory enhancement transistor $T_4$ having a grounded source and a drain connected to input X of the sense amplifier, while its gate is driven by circuit means comprising a programmed cell $NP_0$ having a grounded source, a gate connected to a supply voltage $V_{cc}$, and a drain connected to one of two terminals of a current mirror $CM_2$, and two enhancement transistors $T_5$ and $T_6$ connected in parallel, and having their sources grounded and their drains connected to the opposite terminal of current mirror $CM_2$. Transistors $T_5$ and $T_6$ are identical to each other and to $T_4$, and their drains are connected to the gate of transistor $T_4$, thus causing, as known in the art, a current to flow in transistor $T_4$ of a value one half the current $I_p$.

With the sense circuit of FIG. 2, the sense amplifier will compare a current $I_v+I_p/2$ either with a current $I_v+I_v/2$, if a nonprogrammed matrix cell was selected, or with a current $I_p+I_v/2$, if a programmed matrix cell is selected.

In other words, the set of inequalities (1) and (2) is now replaced by the following inequalities:

$$I_{vm}+I_{vr}/2 \; I_{vr}+I_p/2 \qquad (6)$$

$$I_{pm}+I_{vr}/2 \; I_{vr}+I_p/2 \qquad (7)$$

where, again, the nonprogrammed matrix cell and the nonprogrammed reference cell are the same, i.e., $I_{vm}=I_{vr}=I_v$. Also, $I_{pm}=I_p$. Then, even if $I_p>0$, the above inequalities become:

$$I_v/2 > I_p/2 \qquad (8)$$

$$I_p/2 < I_v/2 \qquad (9)$$

Since the current in a nonprogrammed cell, even at very high supply voltages, must always be greater than the current in a programmed cell, inequalities (8) and (9) must always be true. Therefore, the sense circuit of FIG. 2 provides for correct recognition of the status of matrix cells even at extreme ranges of the parameters, or for highly deteriorated conditions of the cells.

The new situation is reflected in line E of FIG. 3, which represents how the quantity $I_v+I_p/2$, and therefore the signal at input X of the sense amplifier, changes with increasing supply voltage $V_{cc}$. It can be appreciated that line E remains vertically equidistant from lines C and D over a greater range of supply voltage.

A preferred embodiment of the invention has been disclosed above, but it is understood that changes may be made to it by a man skilled in the art within the scope of the invention. In particular, while the circuit driving the gate of the compensatory programmed cell has been described as providing a current half the current in a programmed cell, a lower or greater value would already be sufficient to achieve the objects of the invention. Moreover, although the word "programmed" used above suggests that programming has been achieved by application of electrical biases, it should be understood also to cover a programming achieved by means of masks during the manufacturing process, e.g., in the production of ROMs.

We claim:

1. A sense circuit for recognizing the programmed or nonprogrammed state for cells in a storage device comprising:
a sense amplifier having a first input and a second input,
a plurality of selectable reference cells having a nonprogrammed state, connected to said first input of said sense amplifier,
a plurality of said cells connected to said second input of said sense amplifier and comprising a set of storage cells for said storage device, wherein each of said storage cells has either a programmed or nonprogrammed state,
a first circuit, which includes a nonprogrammed one of said cells, said first circuit connected to said second input of said sense amplifier for providing a current flow to said second input approximately equal to a selected fraction of the current flow through one of said cells having a nonprogrammed state when such a nonprogrammed cell is selected, and
a second circuit, which includes a programmed one of said cells, said second circuit connected to said first input of said sense amplifier for providing a current flow to said first input approximately equal to selected fraction of the current flow through one of said cells having a programmed state when such a programmed cell is selected.

2. The sense circuit recited in claim 1 wherein said second circuit comprises a first MOS transistor having the source and drain terminals thereof connected between said first input of said sense amplifier and a reference terminal and having the gate terminal connected to a control circuit which causes said first transistor to have a current flow therethrough equal to approximately one half the current that flows in a programmed one of said cells when such a programmed cell is selected.

3. The sense circuit recited in claim 2 wherein said control circuit comprises a current generator connected to said programmed cell in said first circuit for producing a first current approximately equal to the current in a programmed one of said cells when such a programmed cell is selected, said current generator connected through a terminal thereof to second and third turned-on transistors which are connected in parallel and to the gate of said first transistor, wherein said second and third transistors have substantially identical characteristics.

4. The sense circuit recited in claim 3 wherein said current generator comprises a current mirror having an input terminal and an output terminal, said programmed cell in said second circuit being connected to said input terminal of said current mirror and being in a permanently turned on state.

5. The sense circuit recited in claim 1 wherein each of said selected fractions is approximately one half.

6. The sense circuit recited in claim 1 wherein each of said cells is an MOS transistor and said nonprogrammed cells are MOS transistors which have a current flow therethrough when selected and said programmed cells are MOS transistors which have essentially zero current therethrough when selected.

7. The circuit of claim 1, further comprising first and second load elements, connected to said first and second inputs of said sense amplifier.

8. A sense circuit for a storage device having a matrix of programmable storage cells, each of which can be either programmed or nonprogrammed, the sense circuit comprising:
a sense amplifier having a first input and a second input,
a plurality of selection lines each having a plurality of storage cells connected thereto,
a plurality of said storage cells connected to said second input of said sense amplifier,
a plurality of nonprogrammed reference cells connected respectively to said selection lines, said reference cells connected to said first input of said sense amplifier,
a first transistor connected to said first input of said sense amplifier and having a control voltage provided to the gate terminal thereof such that said first transistor provides a current flow with said first input approximately equal to a selected fraction of the current through a one of said programmed storage cells when such a programmed cell is selected, and
a second transistor connected to said second input of said sense amplifier and having a control voltage provided to the gate terminal thereof such that said second transistor provides a current flow with said second input approximately equal to a selected fraction of the current through a one of said nonprogrammed storage cells when such a nonprogrammed cell is selected.

9. The sense circuit recited in claim 8 wherein each of said cells is an MOS transistor and said nonprogrammed cells are MOS transistors which have a current flow therethrough when selected and said programmed cells are MOS transistors which have essentially zero current therethrough when selected.

10. The sense circuit recited in claim 8 wherein the control signal for said first transistor is produced by a current mirror circuit connected to a cell corresponding to a programmed one of said storage cells and the control signal for said second transistor is produced by a current mirror circuit which is connected to a cell corresponding to a nonprogrammed one of storage cells.

11. The sense circuit recited in claim 8 wherein said selected fraction is one half.

12. The circuit of claim 8, further comprising first and second load elements, connected to said first and second inputs of said sense amplifier.

13. A method for recognizing the programmed or nonprogrammed state of storage cells in a storage device, comprising the steps of:
selecting one of said storage cells and concurrently selecting a reference cell, said selected storage cell connected to a first input of a sense amplifier and said selected reference cell connected to a second input of said sense amplifier, said reference cell being similar to one of said storage cells having a nonprogrammed state,
providing a first current transfer to said first input in parallel with said selected cell, said first current transfer having an amplitude approximately proportional to the current flow through a selected one of said storage cells when such cell is programmed,
providing a second current transfer to said second input in parallel with said selected reference cell, said second current transfer having an amplitude approximately proportional to the current flow through a selected one of said storage cells when such a cell is nonprogrammed, and generating a data output by said sense amplifier which data output is a function of the currents through said first and second inputs thereof; whereby said data output corresponds to the programmed or nonprogrammed state of said selected storage cell.

14. The method for recognizing the programmed or nonprogrammed state of storage cells in a storage device as recited in claim 12 wherein the step of selecting one of said storage cells comprises activating an MOS transistor storage cell and activating an MOS transistor reference cell wherein the programmed or nonprogrammed state of said storage cell determines the amplitude of current flow therethrough.

15. The method for recognizing the programmed or nonprogrammed state of storage cells in a storage device as recited in claim 13 wherein the step of providing a first current transfer is carried out as a function of the current flow through a cell corresponding to a programmed one of said storage cells when such a storage cell is selected and wherein the step of providing a second current transfer is carried out as a function of the current flow through a cell corresponding to a nonprogrammed one of said storage cells when such a storage cell is selected.

16. The method for recognizing the programmed or nonprogrammed state of storage cells in a storage device as recited in claim 13 wherein the step of providing a first current transfer is carried out by the operation of a first current mirror circuit connected to said first input and connected to a cell corresponding to a programmed one of said storage cells when such a programmed cell is selected and wherein the step of providing a second current transfer is carried out by the operation of a second current mirror circuit connected to said second input and connected to a cell corresponding to a nonprogrammed one of said storage cells when such a nonprogrammed cell is selected.

17. An integrated circuit non-volatile memory sense amplifier circuit, comprising:
a differential sense amplifier having a first input and a second input;
one or more reference cells having a nonprogrammed state, and being connectable to said first input of said sense amplifier;
a plurality of memory cells connectable to said second input of said sense amplifier, wherein each of said storage cells has either a programmed or nonprogrammed state;
first and second load elements, connected to said first and second inputs of said sense amplifier;
a first offset current circuit, connected to said second input of said sense amplifier to supply a current proportional to the current flow through a nonprogrammed cell; and
a second offset current circuit, connected to said first input of said sense amplifier to supply a current proportional to the current flow through a programmed cell.

18. The integrated circuit of claim 17, wherein said first and second offset current circuits each comprise two current mirrors.

19. The integrated circuit of claim 17, wherein said first offset current circuit comprises a nonprogrammed dummy cell, and a current mirror connected to copy the current drawn by said dummy cell onto two paralleled transistors, and an additional transistor which is configured to mirror the current on one of said paralleled transistors onto said sense amplifier input.

20. The circuit of claim 17, wherein said second offset current circuit comprises a programmed dummy cell, and a current mirror connected to copy the current drawn by said dummy cell onto two paralleled transistors, and an additional transistor which is configured to mirror the current on one of said paralleled transistors onto said sense amplifier input.

* * * * *

UNITED STATES PATENT AND TRADEMARK OFFICE
CERTIFICATE OF CORRECTION

PATENT NO. : 5,276,644

DATED : January 4, 1994

INVENTOR(S) : Luigi Pascucci; Marco Olivo

It is certified that error appears in the above-identified patent and that said Letters Patent is hereby corrected as shown below:

On the title page: Item [30]
Foreign Application Priority Data

November 19, 1990  European Patent Application No. 90830530.3

Signed and Sealed this

Eighth Day of November, 1994

Attest:

BRUCE LEHMAN

*Attesting Officer*          *Commissioner of Patents and Trademarks*